United States Patent [19]

Merrell

[11] Patent Number: 4,521,897
[45] Date of Patent: Jun. 4, 1985

[54] APPARATUS FOR SYNCHRONIZING THE OPERATION OF MASTER AND SLAVE COUNTERS

[75] Inventor: Richard G. Merrell, Hebron, Ill.

[73] Assignee: Zenith Electronics Corporation, Glenview, Ill.

[21] Appl. No.: 518,509

[22] Filed: Jul. 29, 1983

[51] Int. Cl.³ .............................................. H03L 7/00
[52] U.S. Cl. .................................... 377/115; 307/471; 307/480; 328/72; 328/155
[58] Field of Search ............. 307/272 A, 219, 471, 307/480; 377/115; 328/55, 63, 72, 155

[56] References Cited

U.S. PATENT DOCUMENTS 3,953,832  4/1976  Streckenbach ....................... 328/63
4,277,693  7/1981  Hoekman ............................. 307/219
4,282,493  8/1981  Moreau ................................ 307/219
4,300,100  11/1981 Marchelli et al. ................... 307/219
4,412,342  10/1983 Khan et al. .......................... 307/480

Primary Examiner—John S. Heyman

[57] ABSTRACT

A master and a slave counter have their outputs coupled to an exclusive OR gate which in turn, supplies the D input of a flip-flop. Clock pulses are coupled to the slave counter through an AND gate which is enabled by the $\overline{Q}$ output of the flip-flop. Clock pulses to the slave counter are inhibited upon occurrence of an output therefrom and until a succeeding output of the master counter occurs, at which time clock pulses are again supplied to both the slave counter and the master counter to synchronize the operation thereof.

7 Claims, 2 Drawing Figures

APPARATUS FOR SYNCHRONIZING THE OPERATION OF MASTER AND SLAVE COUNTERS

BACKGROUND OF THE INVENTION

This invention relates in general to counters and particularly to means for synchronizing operation of a master counter and a slave counter.

The invention was developed in connection with circuitry for decoding television signals having suppressed synchronizing pulses and inverted video information. However, the invention will find use in many environments where synchronization of two counters is required and no master reset pulse is available.

OBJECTS OF THE INVENTION

A principal object of the invention is to provide a novel method and means for synchronizing the operation of two counters.

A further object of the invention is to provide an improved phasing circuit for synchronizing the operation of a slave counter with a master counter.

SUMMARY OF THE INVENTION

In accordance with the invention, first and second identical counters have their outputs coupled to synchronizing means for controlling the application of clock pulses to the counters. The synchronizing means is responsive to non-synchronized operation of the counters for freezing the state of the second counter by inhibiting the application of clock pulses thereto upon the occurrence of an output of the second counter. In response to the next successive output from the first counter, clock pulses are re-applied to the second counter such that the two counters thereafter operate in synchronism.

BRIEF DESCRIPTION OF THE DRAWINGS

Further objects and advantages of the invention will be apparent to those skilled in the art upon reading the following description in conjunction with the drawings in which.

DESCRIPTION OF THE PREFERRED EMBODIMENT

Figure 1:
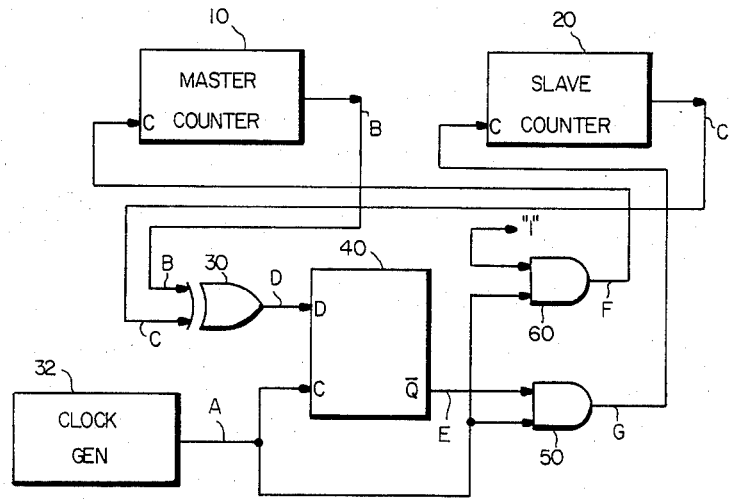
FIG. 1 represents a simplified block diagram of the invention.

Referring to FIG. 1, a master counter 10 and a slave counter 20 each have a clock input and an output. The outputs of the counters are connected to a two input exclusive OR circuit 30 that has its output connected to the D input of a flip-flop 40. The C (clock) input of flip-flop 40 is supplied with a series of clock pulses (clock signal) from a clock generator 32 and its $\overline{Q}$ output is connected to one input of a two input AND gate 50. The clock signal is supplied to the second input of AND 50 and to an input of an AND gate 60. The remaining input of AND 60 is connected to a logic 1 level, thus enabling AND 60 at all times. The outputs of AND's 50 and 60 are connected to the clock inputs (C) of counters 20 and 10, respectively.

Figure 2:
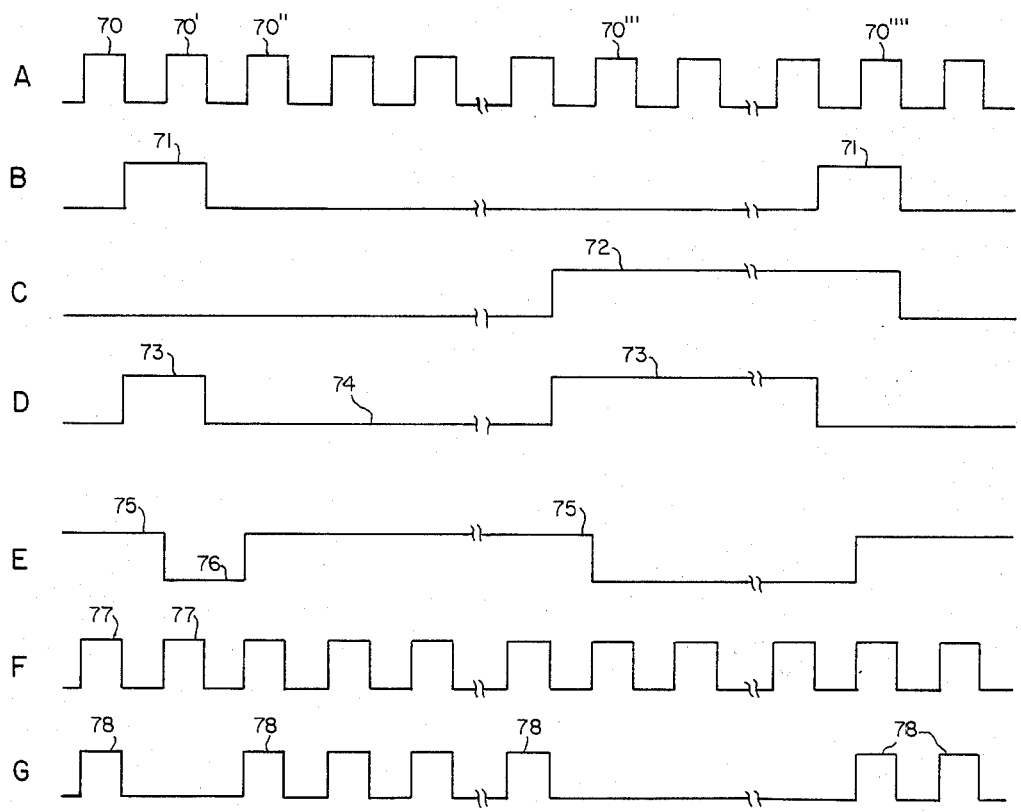
FIG. 2 is a series of pulse waveforms taken at various points in the circuit of FIG. 1.

At various points in the circuit, the leters A - G are used to indicate similarly identified waveforms depicted in FIG. 2 and reference to both figures together may be helpful in understanding the invention.

Waveform A comprises a series of positive-going clock pulses 70. Waveform B is the output of master counter 10 and is shown as a square wave pulse 71 whose duration is equal to the period of the clock signal, although the invention is equally applicable where the output of the master counter is a square wave pulse whose duration is greater than one period of the clock signal. Waveform C represents an output of slave counter 20 when it is not in synchronism with counter 10 and is seen to be a long duration square wave 72. Under synchronous operating conditions, counter 20 operating in unison with counter 10, waveform C will be identical to waveform B since both counters will have identically phased outputs which are of the same duration. The long duration square wave 72 merely indicates that counter 20 is being held or "frozen" in a state wherein its output is logic "1". Waveform D is the control signal output of exclusive OR 30 that is supplied in conjunction with the clock pulses at its C input to control the state of flip-flop 40.

Waveform E at the $\overline{Q}$ output of flip-flop 40 represents an enable signal that is supplied to the input of AND gate 50. Its logic "1" level portions are indicated by 75 and its logic "0" level portions by 76. Waveforms F and G are the series of clock pulses applied to counter 10 and counter 20, respectively. Master counter 10 receives a continuous series of clock pulses 77 (corresponding to waveform A clock pulses 70) whereas the clock pulses 78 supplied to slave counter 20 are inhibited at times. Specifically, waveform G indicates that clock pulses 78 are inhibited whenever the $\overline{Q}$ output of flip-flop 40 is at a logic level "0".

The waveforms illustrate conditions when the master counter produces a "1" level output before the slave counter. Thus, during the first occurrence of pulse 71 of waveform B, exclusive OR 30 has a "1" input from counter 10 and a "0" input from counter 20 and produces a "1" level on terminal D, i.e. pulse 73, of flip-flop 40 as indicated by waveform D. This "1" level signal sets flip-flop 40 in response to the positive-going edge of clock pulse 70' placing the $\overline{Q}$ output of flip-flop 40 at a "0" and thereby inhibiting AND gate 50 (see portion 76 of waveform E). Thus, AND gate 50 inhibits the application of clock pulse 70' to slave counter 20 (see waveform G). Since the output of master counter 10 has a duration equal to the period of a clock pulse, the D input of flip-flop 40 reverts to "0" as shown at 74 when both inputs to exclusive OR 30 go to "0", i.e. in response to the negative-going edge of clock pulse 70'. The $\overline{Q}$ output of flip-flop 40 is therefore switched to "1" in response to the positive-going edge of the next clock pulse 70'' thereby enabling AND gate 50 such that clock pulses are again supplied to slave counter 20. The result is that a single clock pulse 70 is omitted from slave counter 20 and it misses a count. This is of no significance and occurs only because at the time of initialization master counter 10 produced an output before slave counter 20.

As soon as slave counter 20 produces an output, indicated by a high logic level 72, exclusive OR 30 again supplies a "1" level input to the D terminal of flip-flop 40. This causes the $\overline{Q}$ output of the flip-flop to go to "0" one-half clock period later in response to the positive-going edge of clock pulse 70''' thereby disabling AND gate 50 and again inhibiting the application of clock pulses to slave counter 20. Depending upon the relative differences in "counts" in the two counters, slave counter 20 may be held in this "1" level output state for a time period nearly equal to that between "1" level outputs of master counter 10. In particular, upon the next occurrence of "1" output from counter 10, both inputs of exclusive OR go to "1" (counter 20 still has a "1" output) and the output of exclusive OR 30 goes low. Flip-flop 40 therefore switches its $\bar{Q}$ output to a "1" in response to the positive-edge of clock pulse 70'''' enabling AND gate 50. Now both master counter 10 and slave counter 20 are synchronized in the sense that their outputs are phase coincident and upon the occurrence of the next clock pulse, begin counting in unison. Both outputs go to "0" after the next clock pulse and the two counters thereafter count in synchronism with outputs 71 and 72 being of the same duration and in phase coincidence.

Continously enabled AND gate 60 is provided to keep the edges of the clock pulses supplied to the counters precisely aligned by compensating for the slight delay encountered in AND gate 50.

It will be appreciated that the logic means exemplified by exclusive OR 30 may also comprise an exclusive NOR with suitable changes in the character of bi-stable flip-flop 40. All of these means together, i.e. exclusive OR gate 30, flip-flop 40 an AND gates 50 and 60 and the clock pulses, comprise synchronization means or phasing means.

What has been described in a novel circuit for synchronizing two counters without requiring a master reset pulse. It is recognized that numerous modificatins and changes in the described embodiment of the invention will be apparent to those skilled in the art without departing from the true spirit and scope thereof. The invention is to be limited only as defined in the claims.

What is claimed is

1. Apparatus for synchronizing the operation of a master and a slave counter comprising:
   means for generating a clock signal;
   logic means developing a control signal representing the exclusive OR/NOR combination of the outputs of said counters;
   bi-stable means responsive to said clock signal and to said control signal for developing an enable signal;
   means for coupling said clock signal to said master counter; and
   gate means responsive to said enable signal for coupling said clock signal to said slave counter, said enable signal inhibiting clocking of said slave counter in response to successively occurring, like polarity transitions of the outputs of said slave counter and said master counters respectively so as to force coincidence between the succeeding opposite polarity transitions of the outputs of the counters, whereby operation of said slave counter is synchronized to operation of said master counter.

2. Apparatus as set forth in claim 1 wherein said bi-stable means comprise a flip-flop having a data input for receiving said control signal and a clock input for receiving said clock signal.

3. Apparatus as set forth in claim 2 wherein said gate means comprise an AND gate having one input coupled to the output of said flip-flop and another intput receiving said clock signal, the output of said AND gate being coupled to the clock input of said slave counter.

4. Apparatus as set forth in claim 3 wherein said gate means further include another AND gate having one input permanently enabled and another input coupled to receive said clock signal, the output of said another AND gate being coupled to the clock input of said master counter.

5. In combination:
   a first counter having a clock input and an output;
   a second counter having a clock input and an output;
   synchronizing means coupled between said clock inputs and said output of said first and said second counters;
   means applying a clock signal to said synchronizing means for application to both said counters; and
   means in said synchronizing means for inhibiting application of said clock signal to said second counter in response to the occurrence of an output therefrom and for subsequently enabling application of said clock signal to said second counter in response to the next successive occurrence of an output of said first counter, whereby said counters are brought into synchronism.

6. The combination as set forth in claim 5 wherein said inhibiting means comprises;
   first gate means for developing a control signal only when one of said first and said second counters produces an output;
   a D-type flip-flop having a D input receiving said control signal and a clock input receiving said clock signal; and
   second gate means having inputs coupled for receiving the output of said flip-flop and said clock signal and having an output coupled to the clock input of said second counter.

7. The method of synchronizing the operation of first and second counters driven from a common clock signal source and producing identical outputs upon reaching identical counts comprising the steps of:
   generating a control signal in response to non-simultaneous outputs from said counters;
   generating an enable signal from said control signal and said clock signal;
   applying said enable signal for inhibiting clocking of said second counter in response to the occurence of an output signal from said second counter; and
   maintaining said second counter inhibited until initiation of the succeeding output of said first counter.

* * * * *